United States Patent [19]
Nakajima et al.

[11] Patent Number: 6,151,036
[45] Date of Patent: Nov. 21, 2000

[54] LARGE CAPACITY DATA STORAGE DEVICE

[75] Inventors: Hirofumi Nakajima, Kamakura; Koichi Ueda; Yuichiro Hattori, both of Yokohama; Ichiro Kuwana, Musashino, all of Japan

[73] Assignee: Canon Kabushiki Kaisha, Tokyo, Japan

[21] Appl. No.: 08/427,693

[22] Filed: Apr. 24, 1995

Related U.S. Application Data

[63] Continuation of application No. 07/965,759, Oct. 23, 1992, abandoned.

[30] Foreign Application Priority Data

Nov. 1, 1991 [JP] Japan .................................. 3-287851
Nov. 13, 1991 [JP] Japan .................................. 3-297140

[51] Int. Cl.[7] ....................................................... G09G 5/00
[52] U.S. Cl. ........................... 345/511; 345/508; 345/516
[58] Field of Search ..................................... 345/188, 189, 345/190, 200, 193, 196, 185, 508, 511; 395/515, 516, 517, 525; 348/571

[56] References Cited

U.S. PATENT DOCUMENTS

| | | | |
|---|---|---|---|
| 4,104,624 | 8/1978 | Hamada | 345/190 |
| 4,141,003 | 2/1979 | Felsentein | 345/190 |
| 4,746,980 | 5/1988 | Petersen | 348/571 |
| 4,852,024 | 7/1989 | Kurakake | 345/190 |
| 4,890,100 | 12/1989 | Kurakake | 345/190 |
| 5,175,533 | 12/1992 | Krenik | 345/190 |

*Primary Examiner*—Bipin Shalwala
*Assistant Examiner*—Kent Chang
*Attorney, Agent, or Firm*—Fitzpatrick, Cella, Harper & Scinto

[57] ABSTRACT

A data storage device includes a main memory into/from which data can be written or read out and an input/output device for receiving the data to be written into the main memory or generating the data read out from the main memory. An addressing device outputs first address data which represent an access address of the input/output device to the main memory on a basis of a unit composed of a predetermined number of data. A convertor converts the first address data into second address data representing an address in the main memory on a basis of single data and an address controller controls the access address of the input/output device to the main memory in accordance with the second address data.

8 Claims, 5 Drawing Sheets

| FRAME NO. | ADDRESS |
|---|---|
| 1 | 0000H |
| 2 | 1000H |
| 3 | 2000H |
| 4 | 3000H |
| 5 | 4000H |
| 6 | 5000H |
| ⋮ | ⋮ |

| FRAME NO. | ADDRESS |
|---|---|
| 1 | 0000H |
| 2 | 3000H |
| 3 | 4000H |
| 4 | 5000H |
| 5 | 6000H |
| ⋮ | ⋮ |

LARGE CAPACITY DATA STORAGE DEVICE

This application is a continuation of application Ser. No. 07/965.759, filed Oct. 23, 1992, now abandoned.

BACKGROUND OF THE INVENTION

1. Field of the Invention

The invention relates to a data storage device and, more particularly, to a device to store a large capacity of data such as image data of a number of picture planes or the like.

2. Related Background Art

A semiconductor memory of a large capacity has relatively cheaply been provided due to the improvement of the semiconductor technique and the use of such a memory as a recording medium of an image recording and reproducing apparatus or as a recording medium in the recording, reproducing, or editing process or the like has been proposed. As compared with the case of using a magnetic tape, magnetic disk, or the like as a recording medium, there are advantages such that the recorded images can be searched at a high speed, a moving image of an arbitrary synchronizing frequency can be recorded and reproduced, and the data can be easily copied or rearranged in the medium.

To store data such as images having a large information amount, however, a very large memory capacity is needed and it is difficult to manage addresses. Namely, in general, since the information amount per unit of the image (that is, per field or frame of the image) is not always equal to the power of 2, processes to allocate the address to each image becomes complicated. To simplify the address allocation, there is considered a method whereby the information amount per unit of the image is forcedly equalized to the power of 2 by adding dummy data or the like. However, the use of such a method causes a use efficiency to be deteriorated.

Therefore, the access to the image memory device has conventionally been performed on a pixel unit basis. A method of accessing to the image memory through an input/output bus has been proposed as a method of realizing multiports, namely, a plurality of inputs and outputs. Even in case of using such a method, however, the access is fundamentally executed on a pixel unit basis.

As mentioned above, even if multiports are realized, since there is a limitation of a transfer speed of the input/output bus, while one input/output (I/O) circuit is accessing, it is difficult to interrupt the access of another I/O circuit. Particularly, in case of the image memory device of a large capacity, the process is frequently waited for a long time.

SUMMARY OF THE INVENTION

It is an object of the invention to solve the problems as mentioned above.

Another object of the invention is to provide a data storage device which can promptly perform the writing and reading operations without executing a complicated address management.

Under the above objects, according to the invention, as a preferred embodiment, there is provided a data storage device comprising: (a) a main memory into/from which data can be written or read out; (b) intput/from means for receiving the data to be written into the main memory or generating the data read out from the main memory; (c) designating means for designating an access address of the input/output means to the main memory on a unit basis of a predetermined amount of data, in which the designating means generates first address data; (d) converting means for converting the first address data into second address data corresponding to an address in the main memory; and (e) address control means for controlling the access address of the input/output means to the memory in accordance with the converting means.

Still another object of the invention is to provide a data storage device which can efficiently use an input/output bus and can easily use a plurality of input/output means in parallel.

Under such an object, according to the invention, as an embodiment, there is provided a data storage device comprising: (a) a main memory into/from which data can be written or read out; (b) input/output means for receiving the data to be written into the main memory or generating the data read out from the main memory; and (c) control means for allowing the access of the input/output means to the main memory to be intermittently executed by using a packet consisting of a predetermined amount of data as a unit.

The above and other objects and features of the present invention will become apparent from the following detailed description and the appended claims with reference to the accompanying drawings.

DESCRIPTION OF PREFERRED EMBODIMENTS

Embodiments of the invention will be described hereinbelow with reference to the drawings.

Figure 1:
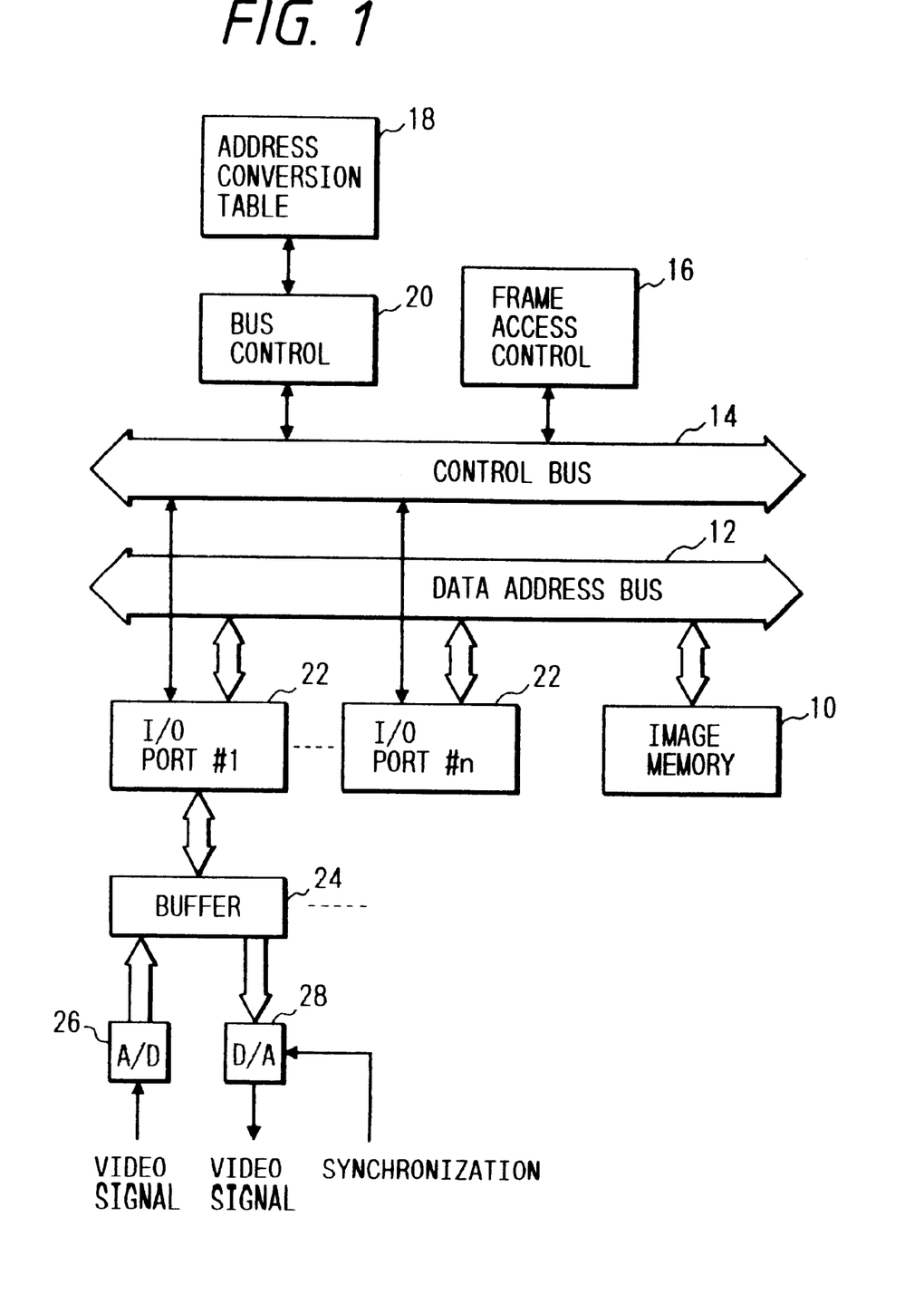
FIG. 1 is a block diagram showing a construction of an image data storage device according to an embodiment of the invention.

FIG. 1 is a block diagram showing a construction of an image data storage device according to an embodiment of the invention. Reference numeral 10 denotes an image memory comprising a random access memory element. The memory 10 has a memory capacity enough to store images of a predetermined number of frames. Reference numeral 12 denotes a data address bus; 14 a control bus of a control signal; and 16 a frame access control circuit to manage the image memory 10 on a frame unit basis.

Reference numeral 18 denotes an address conversion table to store a correspondence table of the frame number of the image which is written or has been written in the image memory 10 and the top address in the image memory 10. The address conversion table 18 comprises an ROM (read only memory) to store initial data and an RAM (random access memory) for updating. Reference numeral 20 denotes a bus control circuit for mediating an access request to the image memory 10 and controlling the data address bus 12.

n input/output (I/O) ports 22 are connected to the data address bus 12 and control bus 14. An A/D converter 26 for converting an external analog video signal into a digital signal and supplying the digital signal to a buffer 24 and a D/A converter 28 for converting the digital video signal generated from the buffer 24 into the analog signal and supplying the analog signal to the outside are connected to each I/O port 22 through the buffer 24. Only one set of the buffer 24, A/D converter 26, and D/A converter 28 is shown in the diagram. The data processes in the A/D converter 26 and D/A converter 28 and the data transfer in the path from the I/O port 22 to the image memory 10 can be asynchronously made operative by the buffer 24.

When the A/D converter 26 converts the external video signal into the digital signal and the digital output data is supplied to the buffer 24, the corresponding I/O port 22 generates a write request to write the data into the image memory 10 to the control bus 14. In response to the write request, the frame access control circuit 16 designates the frame number and permits the writing operation so long as there is a surplus capacity in the image memory 10. The frame access control circuit 16 can not only control the whole memory area in the image memory as one memory area but also divide the whole memory area in the image memory into a plurality of memory areas and control them. In the latter case, the I/O port 22 can be also individually allocated to each of the divided memory areas.

Figure 2A:
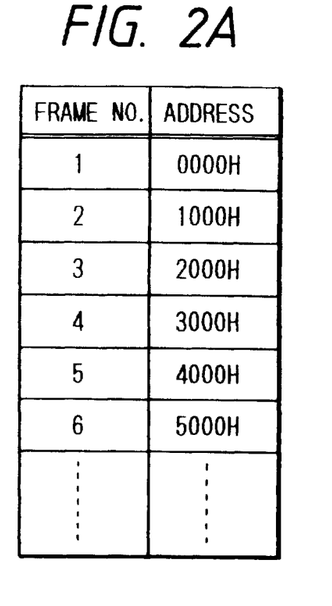
FIGS. 2A and 2B are diagrams showing an example of the content of a conversion table in the device of FIG. 1 and an address map in an image memory.
Figure 2B:
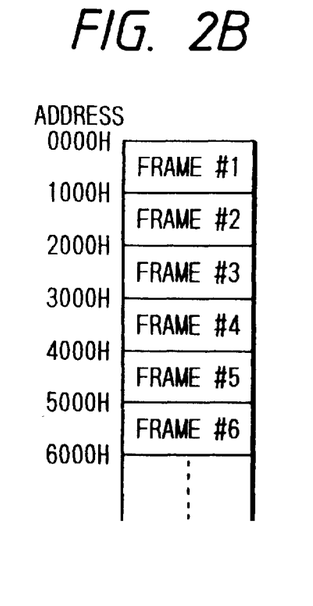

The frame number designated by the frame access control circuit 16 is supplied to the bus control circuit 20 through the control bus 14. The bus control circuit 20 assigns the supplied frame number into the address conversion table 18 and forms a table and reads out the corresponding top address. FIGS. 2A and 2B show the relation between the content of the conversion table 18 and the memory map in the image memory 10. FIG. 2A shows the content of the conversion table 18. FIG. 2B shows the memory map in the image memory 10.

In accordance with the top address read out from the address conversion table 18, the bus control circuit 20 writes the image data which is supplied from the I/O port 22 to the data address bus 12 into the image memory 10. The bus control circuit 20 arbitrates the access requests from a plurality of I/O ports 22.

When reading out desired image data from the image memory 10, the frame number of a desired image to be read out and the output port are supplied to the frame access control circuit 16. When the supplied frame number and output port are valid, the frame access control circuit 16 transfers such designated frame number and output port to the bus control circuit 20. The bus control circuit 20 reads out the top address in the image memory with reference to the address conversion table 18. The image data of one frame is sequentially read out from the top address in the image memory and sent to the data address bus 12. The I/O port 22 which has been designated as an output port fetches the image data from the data address bus 12 and transmits to the buffer 24. The supplied image data is speed-converted in the buffer 24 and is converted into the analog signal by the D/A converter 28. The analog signal is supplied to the outside. The D/A converter 28 can be driven by an external sync signal of an arbitrary frequency.

Figure 3A:
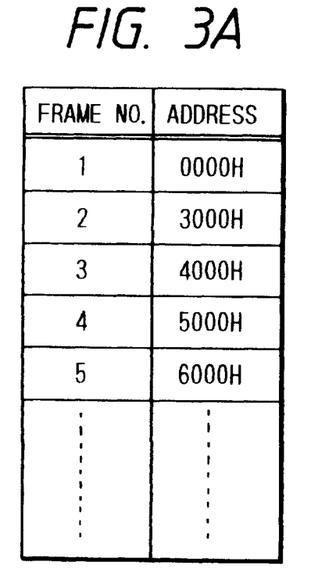
FIGS. 3A and 3B are diagrams showing another example of the content of the conversion table in the device of FIG. 1 and the address map in the image memory.
Figure 3B:
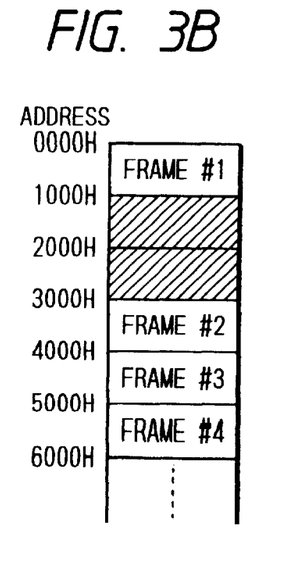

As described before, the address conversion table 18 comprises the ROM to store an initial table and the RAM for updating. When the system is made operative, the content of the ROM is transferred to the RAM and the RAM is referred as a conversion table. Due to this, the conversion table can be rewritten and used even during the operation of the system. For instance, a defective memory area can be avoided during the operation of the system. FIGS. 3A and 3B show a conversion table in the case where the areas in a range from the address 1000H to the address 2999H (less than 3000H) are not used. Namely, FIG. 3A shows the content of the conversion table 18. FIG. 3B shows a memory map of the image memory 10. Hatched portions in FIG. 3B denote the memory areas which are not used.

In the above embodiment, even when the memory capacity of the image memory 10 is increased, it is sufficient to merely increase the conversion table and the complicated address management is unnecessary. Further, even when the whole memory area in the image memory 10 is divided into a plurality of areas and used, the write and read addresses can be easily obtained.

A compressing circuit and an expanding circuit can be also connected among the buffer 24, the D/A converter 26, and the A/D converter 28.

Although the above embodiment has been described on the assumption that the data amount of one frame is constant to the power of b 2, it is not always necessary to set it to the power of 2. The invention, further, can be also applied to the case where the data amount of one frame differs depending on a resolution, compression rate, or the like. When the data amount of one frame differs, it is sufficient that at an end time point of the writing of one frame, the top address of the next frame is set into the address conversion table 18. If an end code is added to the end of the data of one frame, the data of one frame can be read out without any trouble even when it is read out from the image memory 10.

As will be easily understood from the above description, according to the device described with reference to FIGS. 1 to 3B, even if the complicated address management is executed, a number of image data can be written into the memory means or can be read out therefrom. The invention can easily cope with the expansion of the memory means.

Figure 4A:
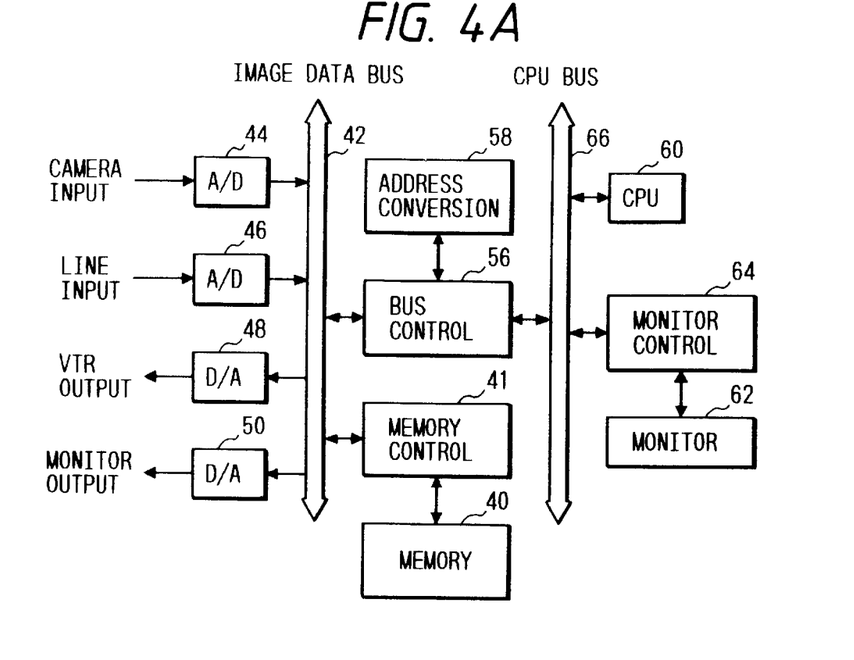
FIGS. 4A and 4B are block diagrams showing a construction of an image data storage device according to another embodiment of the invention.
Figure 4B:
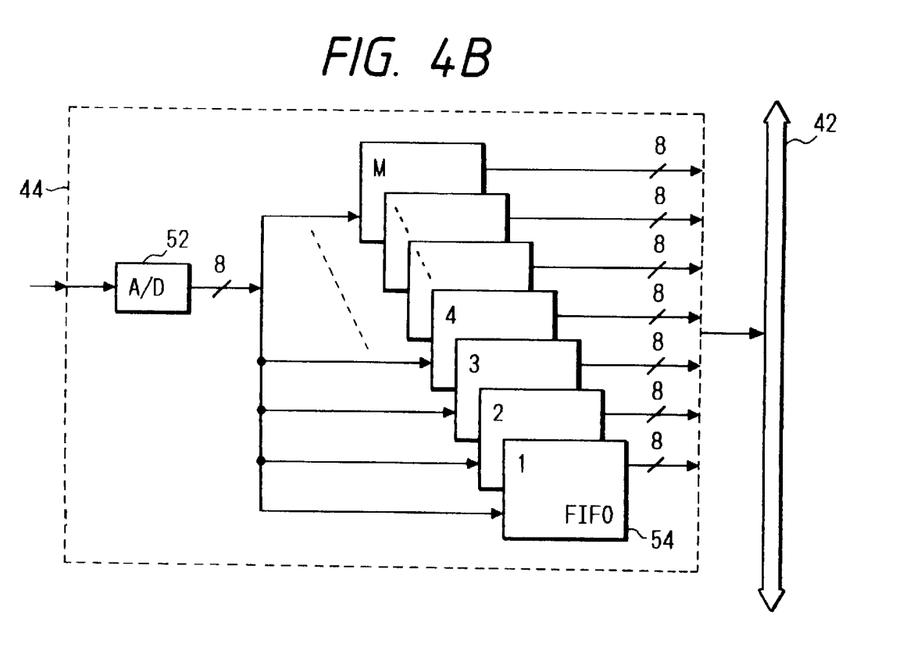

FIGS. 4A and 4B are block diagrams showing a construction of an image data storage device according to another embodiment of the invention. FIG. 4A is a block diagram showing a whole construction. FIG. 4B is a diagram showing an example of an internal circuit of an A/D converting circuit as an input port.

In FIG. 4A, reference numeral 40 denotes a memory to store image data. The memory 40 has a memory capacity sufficient to store data of a plurality of frames. Reference numeral 41 denotes a memory control circuit to control the memory 40; 42 an image data bus to access the memory 40 through the memory control circuit 41; 44 and 46 A/D converting circuits for converting analog video signals into digital signals; and 48 and 50 D/A converting circuits for converting the image data read out from the memory 40 into the analog signals and for supplying them onto the image data bus 42.

In the embodiment, the A/D converting circuit 44 is used for a camera input, the A/D converting circuit 46 is used for a line input, the D/A converting circuit 48 is used for a VTR output, the D/A converting circuit 50 is used for a monitor output, and the input and output of data to/from the image data bus 42 are executed on a packet unit basis.

As shown in FIG. 4B, the A/D converting circuit 44 comprises A/D converter 52 and M FIFO (First-in First-out) memories 54 each for forming a packet from an 8-bit output signal of the A/D converter 52. The A/D converting circuit 46 is also constructed in a manner similar to the A/D converting circuit 44. Opposite to the A/D converting circuits 44 and 46, each of the D/A converting circuits 48 and 50 comprises M FIFO memories to which the packets are supplied from the image data bus 42 and a D/A converter for converting the digital output signals from the FIFO memories into the analog signal.

Reference numeral 56 denotes a bus control circuit to control the input and output operations among the A/D converting circuits 44 and 46, the D/A converting circuits 48 and 50, and the memory 40 through the image data bus 42 and memory control circuit 41. Reference numeral 58 denotes an address conversion circuit for generating the top address in the memory 40, the number of necessary packets, and the number of data in one packet in accordance with the designation of the frame number and the number of frames which are sent from the bus control circuit 56. The address conversion circuit 58 comprises an ROM to store initial values and an RAM for updating during the operation of the circuit.

Reference numeral 60 denotes a CPU to control the whole system; 62 a monitor to display an operating state; 64 a monitor control circuit to control the monitor 62; and 66 a CPU bus to mutually connect the CPU 60, monitor control circuit 64, and bus control circuit 56.

Figure 5:
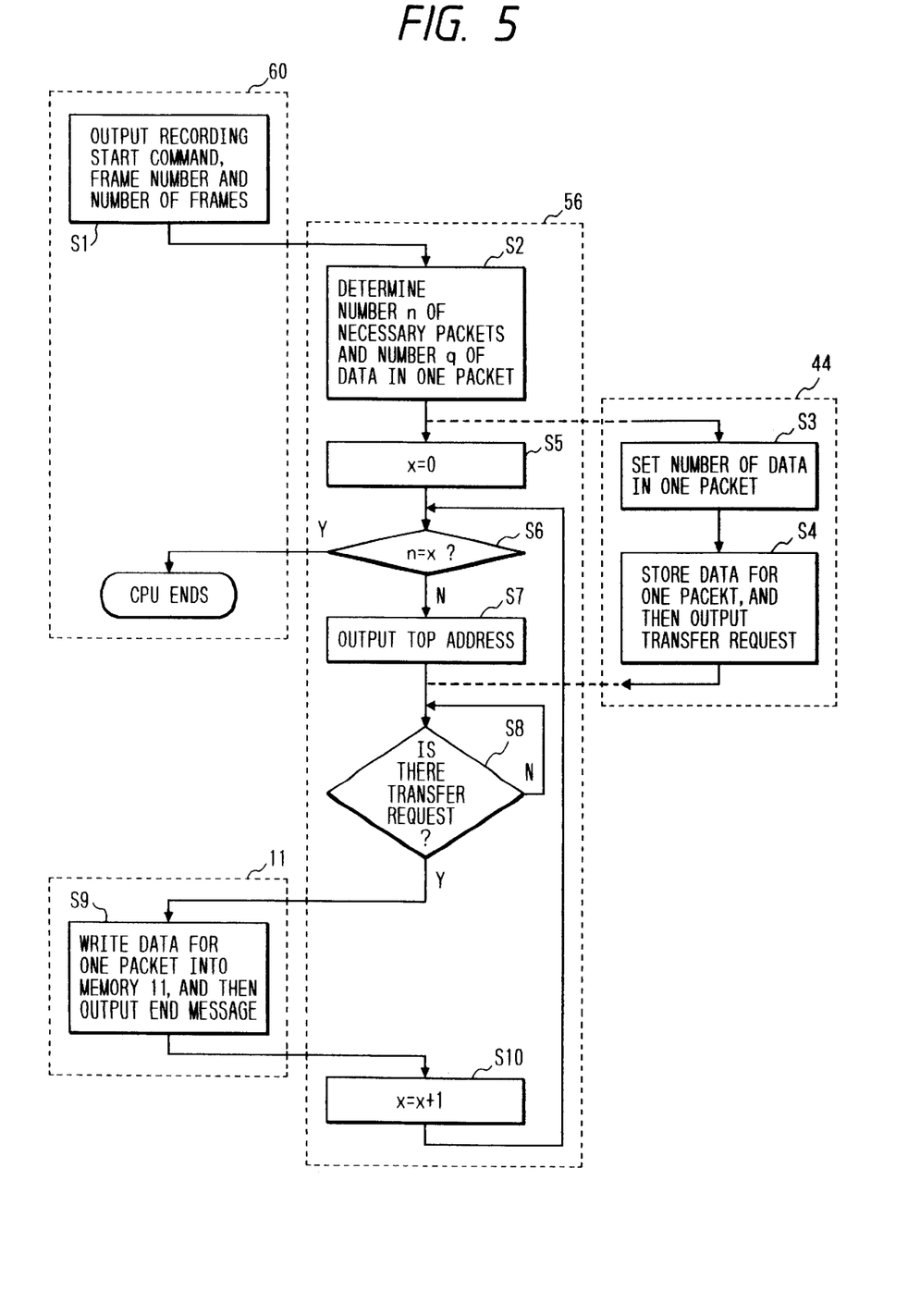
FIG. 5 is a flowchart for explaining the operation of the device of FIG. 4.

First, the operation of the embodiment will be explained with respect to the case of storing the input data from the camera into the memory 40 as an example. FIG. 5 is a flowchart for the operation in this instance. The CPU 60 generates a signal to start the recording of the camera input data and a recording amount (frame number and the number of frames) to the bus control circuit 56 (step S1). With reference to the address conversion circuit 58, the bus control circuit 56 obtains the top address in the memory 40, the number n of necessary packets, and the number q of data in one packet with reference to the address conversion circuit 58 on the basis of the frame number and the number of frames which are sent from the CPU 60. The number q of data in one packet obtained is transferred to the A/D converting circuit 44 through the image data bus 42 and the top address is transferred to memory control circuit 41.

In the A/D converting circuit 44, the number q of data in one packet is set into the control section of the FIFO memories 54 (step S3). The A/D converter 52 converts the analog input video signal from the camera into the digital signals. The digital signals are accumulated into the FIFO memories 54. When q data of one packet are accumulated in the FIFO memories 54, a transfer request is sent to the image data bus 42. The above operations are started after the bus control circuit 56 finishes the process in step S2 or a process in step S10, which will be explained hereinlater.

On the other hand, the bus control circuit 56 clears a variable x for management of the number of packets (S5) and transfers the top address to the memory control circuit 41 every packet which is transferred (S7) and waits for the transfer request from the A/D converting circuit 44 (S8). In response to the transfer request from the A/D converting circuit 44, the image data bus 42 is released for the A/D converting circuit 44. The memory control circuit 41 writes the data from the A/D converting circuit 44 into the memory 40.

When the memory 40 comprises a DRAM (dynamic random access memory), the data on the image data bus 42 is written into the memory 40 at a high speed in a high speed page mode or a writing mode corresponding thereto. After the data of one packet was written, an end message is sent to the bus control circuit 56 (S9). The bus control circuit 56 increases the variable x in accordance with the end message (S10).

Until the number n of necessary packets are transferred, namely, until n is equal to x (S6), the bus control circuit 56 repeats the processes in steps S7 to S10 and the A/D converting circuit 44 repeats the processes in steps S3 and S4. When n=x, an end message is sent to the CPU 60 and the CPU 60 finishes the memory control of the camera input.

Figure 6:
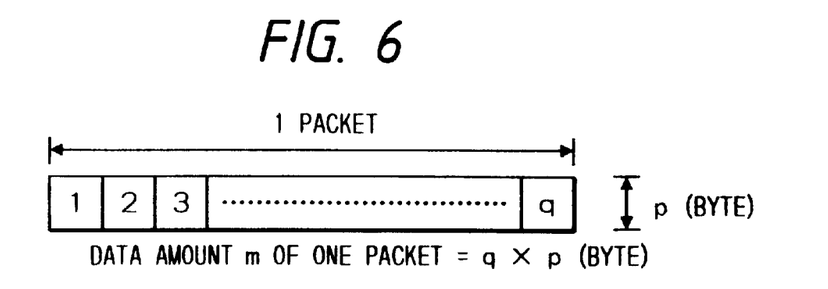
FIG. 6 is a diagram showing a construction of a packet in the device of FIG. 4.

FIG. 6 shows a data construction of one packet. q denotes the number of data of one packet which is designated by the bus control circuit 26 and can be freely changed. p denotes a width (bytes) of the image data bus. The number m of data of one packet is $$m = q \times p$$

Figure 7:
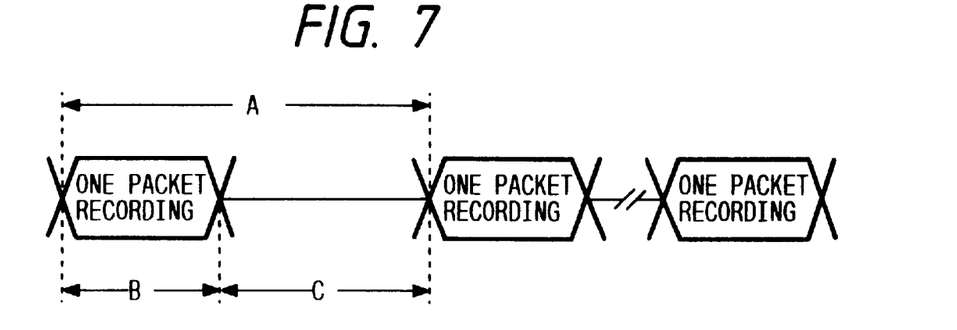
FIG. 7 is a timing chart for explaining the operation of the device of FIG. 4 when storing data supplied from a camera.

FIG. 7 shows a timing chart for the above operation to write the camera input data into the memory 10. In the diagram, A denotes a period of time to accumulate data of one packet to the A/D converting circuit 44 and B indicates a period of time to write data of one packet into the memory 40. In the period of time A, the image data bus 42 is not used for a period of time C excluding the period of time B. In the period of time C, the image data bus 42 can be used by the other A/D converting circuit 46 or the D/A converting circuits 48 and 50.

Figure 8:
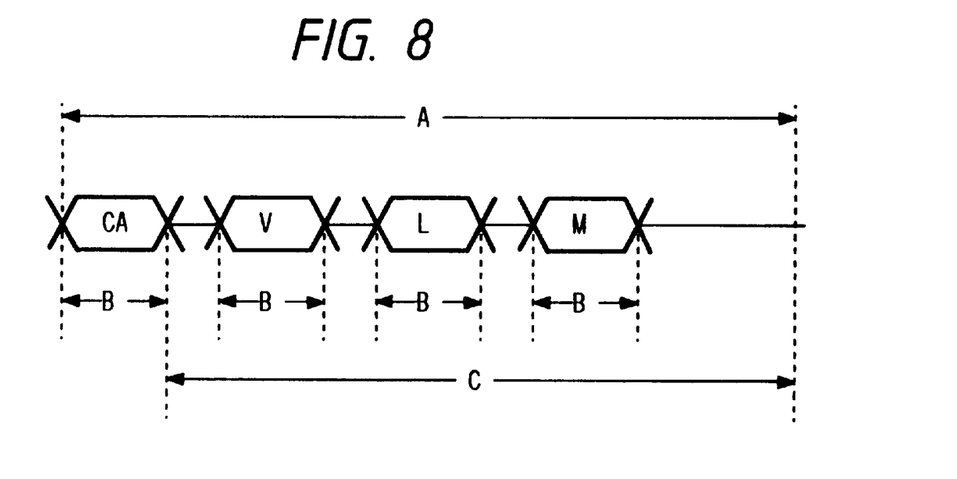
FIG. 8 is a timing chart for explaining the operation of the device of FIG. 4 when a plurality of input/output devices are simultaneously used.

FIG. 8 shows a timing chart in the case of sequentially interrupting the VTR output (D/A converting circuit 48), line input (A/D converting circuit 46), and the monitor output (D/A converting circuit 50) in the period of time C. Thus, four operations such that the camera input data is written into the memory 40, the content of the memory 10 is supplied to the VTR, the line input data is written into the memory 40, and the content of the memory 40 is supplied to the monitor can be executed in a short period of time.

As will be easily understood from the above description, according to the device of the embodiment described in FIGS. 4 to 8, the input/output buses can be efficiently used and the address management can be easily performed. Since the number of data of one packet can be changed, the memory means can be effectively used. There is also an advantage such that the access can be performed substantially at a high speed.

What is claimed is:

1. An image data storage device, comprising:
   (a) a data bus;
   (b) a main memory into which image data can be written via the data bus;
   (c) input means for inputting the image data to be written into said main memory in a byte unit composed of a plurality of bits corresponding to a pixel, said input means including packetizing means for packetizing the input image data so that each packet is composed of a plurality of bytes;
   (d) control means for controlling data transferring via the data bus so that said input means intermittently accesses said memory by means of the packet; and
   (e) determining means for variably determining a number of bytes corresponding to the packets in response to an operation of said control means.

2. A device according to claim 1, wherein said control means includes generating means for generating first address data which includes data representing a number of an image frame, converting means for converting the first address data into second address data representing a starting address from which each packet is written into the main memory in a unit of data composed of at least one byte, and means for controlling the access address to said main memory in accordance with the second address data.

3. A device according to claim 2, wherein said input means includes a plurality of input circuits each of which can access said main memory.

4. A device according to claim 2, wherein said input means includes an A/D converter for converting an analog image signal into a digital image signal and a buffer memory for accumulating an output of said A/D converter, and for transmitting the data to said main memory in a unit of the packet.

5. A device according to claim 4, wherein a period in which each packet consisting of the plurality of bytes is transferred from the buffer memory to said main memory is smaller than a period in which the A/D converter generates the plurality of bytes.

6. A device according to claim 2, wherein said converting means includes a memory which stores the second address data corresponding to the first address data.

7. An image data storage device comprising:
(a) a main memory into which image data can be written;
(b) input means for inputting the image data to be written into said main memory in a unit composed of a plurality of bits corresponding to a pixel, said input means including packetizing means for packetizing the input image data so that each packet is composed of a plurality of bytes;
(c) designating means for designating an entire amount of the image data which is written into said main memory;
(d) determining means for variably determining a number of bytes corresponding to the packet in accordance with the entire amount of the image data; and
(e) control means for controlling said input means so that said input means intermittently accesses said main memory by means of the packet.

8. A device according to claim 7, wherein said designating means designates the total amount of the image data by using a number of frames.

* * * * *

UNITED STATES PATENT AND TRADEMARK OFFICE
CERTIFICATE OF CORRECTION

PATENT NO. : 6,151,036
DATED : November 21, 2000
INVENTOR(S) : Hirofumi Nakajima et al.

Page 1 of 1

It is certified that error appears in the above-identified patent and that said Letters Patent is hereby corrected as shown below:

Title page, Item [57] Abstract,
Line 8, "convertor" should read -- converter --.

Column 1,
Line 63, "intput/from" should read -- input/output means --.

Column 3,
Line 64, "transmits" should read -- transmits it --.

Column 4,
Line 28, "b 2, " should read -- 2, --.

Column 6,
Line 15, "26" should read -- 56 --;
Line 64, "response to an" should read -- synchronization with a timing at which said input means intermittently accesses said main memory, the time being controlled by --;
Line 65, "operation of" should be deleted.

Signed and Sealed this

Twenty-third Day of October, 2001

Attest:

NICHOLAS P. GODICI
Attesting Officer
Acting Director of the United States Patent and Trademark Office